(12) United States Patent
Ikeda et al.

(10) Patent No.: US 8,581,622 B1
(45) Date of Patent: Nov. 12, 2013

(54) SEMICONDUCTOR DEVICE

(75) Inventors: Yasuhiro Ikeda, Fujisawa (JP); Yutaka Uematsu, Kawasaki (JP); Satoshi Muraoka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/512,465

(22) PCT Filed: May 16, 2012

(86) PCT No.: PCT/JP2012/003188
§ 371 (c)(1),
(2), (4) Date: May 29, 2012

(51) Int. Cl.
*H03K 17/16* (2006.01)

(52) U.S. Cl.
USPC .............................. 326/30; 326/82

(58) Field of Classification Search
USPC ............... 326/21, 30, 82, 83, 86, 87
See application file for complete search history.

(56) References Cited

U.S. PATENT DOCUMENTS

| | | | | |
|---|---|---|---|---|
| 6,493,394 | B2* | 12/2002 | Tamura et al. | 375/257 |
| 7,915,912 | B2* | 3/2011 | Oh et al. | 326/30 |
| 2005/0162184 | A1 | 7/2005 | Shibata et al. | |
| 2005/0264316 | A1* | 12/2005 | Atkinson | 326/30 |
| 2006/0170453 | A1* | 8/2006 | Zerbe et al. | 326/37 |
| 2008/0159026 | A1 | 7/2008 | Oh et al. | |
| 2009/0015289 | A1* | 1/2009 | Takekuma et al. | 326/30 |
| 2009/0313410 | A1 | 12/2009 | Jeong et al. | |
| 2010/0327902 | A1* | 12/2010 | Shau | 326/30 |
| 2011/0026293 | A1* | 2/2011 | Riho | 365/63 |
| 2011/0026334 | A1* | 2/2011 | Bae et al. | 365/189.11 |

FOREIGN PATENT DOCUMENTS

JP 2005-236965 9/2006

OTHER PUBLICATIONS

Notification of Transmittal of the International Search Report and the Written Opinion of the International Searching Authority, mailed Dec. 21, 2012, (8 pgs.) [in English].

* cited by examiner

*Primary Examiner* — Don Le
(74) *Attorney, Agent, or Firm* — Antonelli, Terry, Stout & Kraus, LLP.

(57) ABSTRACT

To suppress power consumption and enhance signal quality as compared with the case where first and second semiconductor elements are terminated only by on-chip input termination resistor circuits. A first semiconductor element with a switching function and a second semiconductor element with a switching function are connected to each other with a substrate interconnection, and a resistor element is connected in parallel with the substrate interconnection. The resistor element is placed at an arbitrary position or a branch point on the signal interconnection.

19 Claims, 12 Drawing Sheets

Fig. 2A
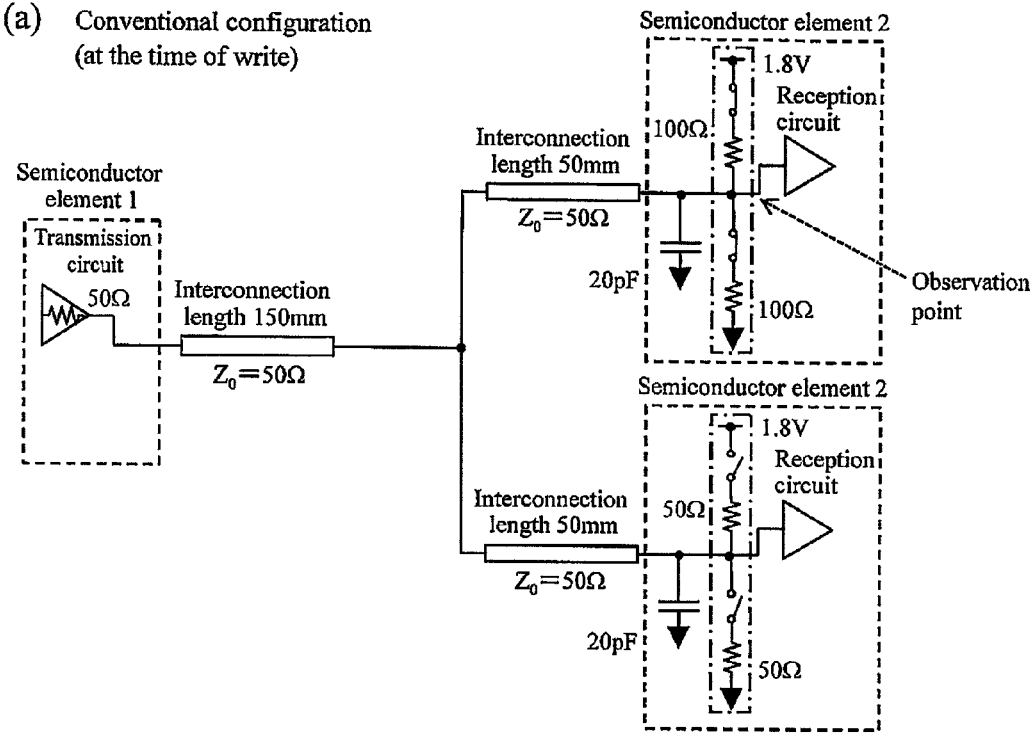
(a) Conventional configuration (at the time of write)
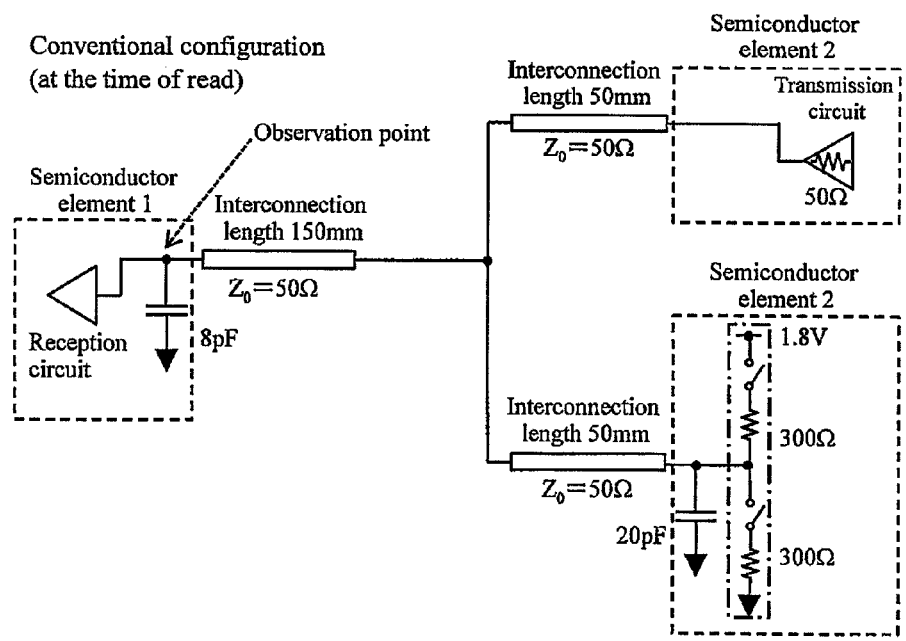
(b) Conventional configuration (at the time of read)

Fig. 2B
(a) Proposed configuration (at the time of write)
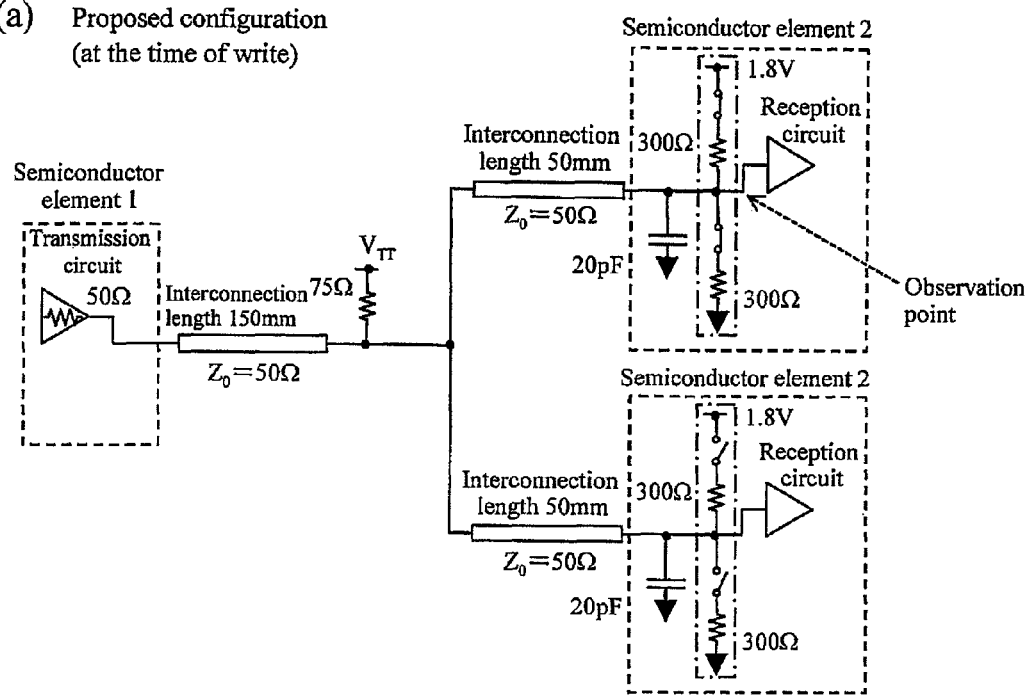
(b) Proposed configuration (at the time of read)
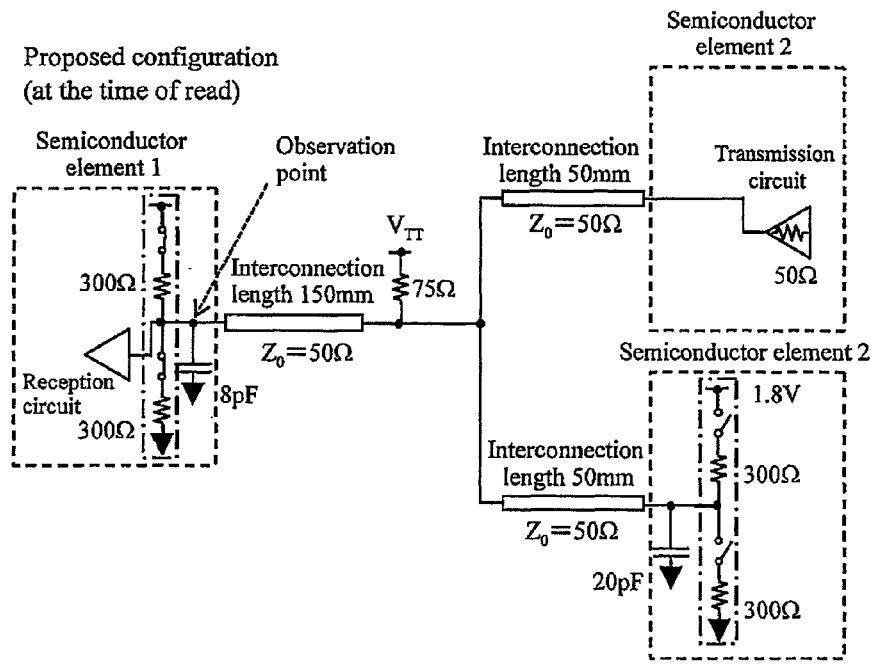

Fig. 3A
(a) Conventional configuration (at the time of write)
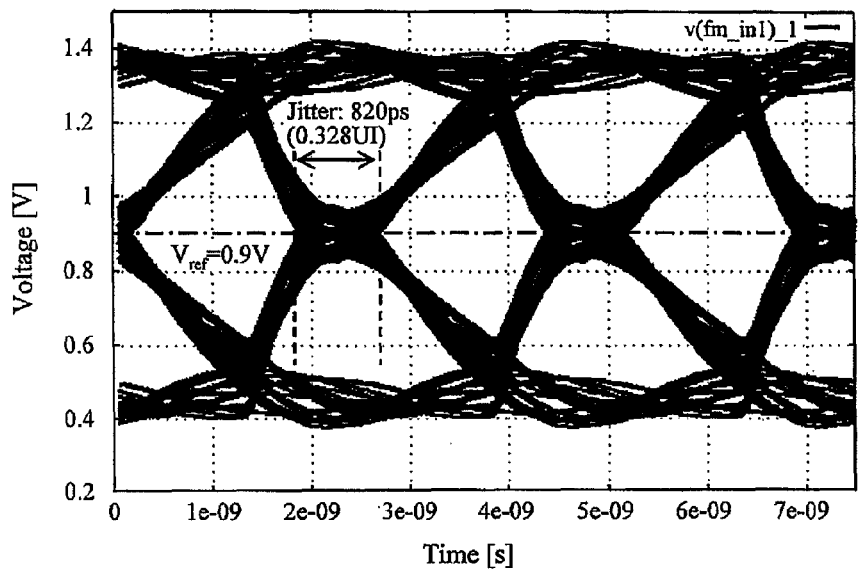
(b) Conventional configuration (at the time of read)
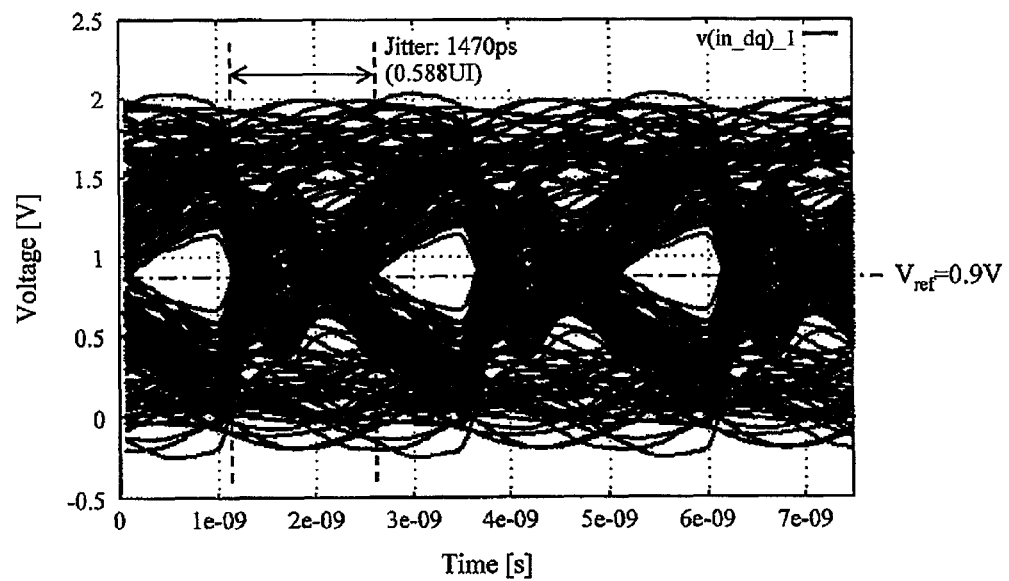

Fig. 3B
(a) Proposed configuration (at the time of write)
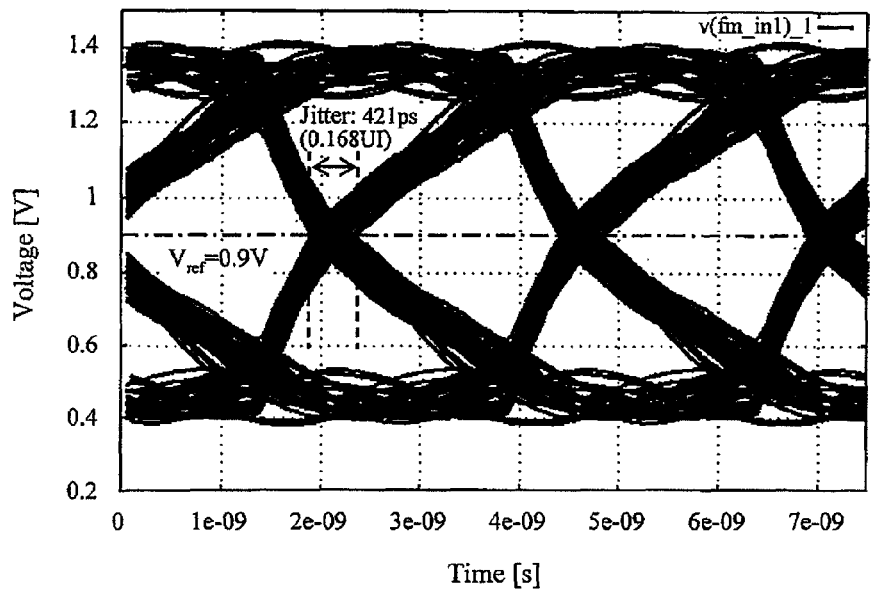
(b) Proposed configuration (at the time of read)
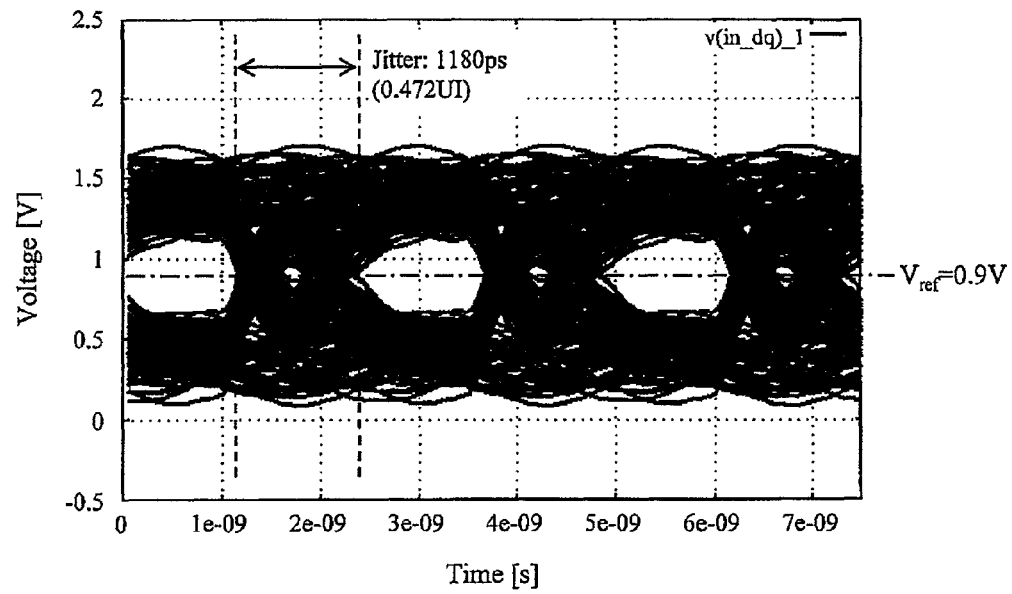

SEMICONDUCTOR DEVICE

TECHNICAL FIELD

The present invention relates to a semiconductor device having a plurality of semiconductor elements and a signal interconnection connecting the semiconductor elements.

BACKGROUND ART

In recent years, low cost, high speed, and high capacity storage devices are being demanded. Accordingly, in some of recent storage devices, a system configuration for connecting a plurality of semiconductor memories to a memory bus and a circuit configuration for placing an on-chip input termination resistor circuit on the semiconductor memory have been employed. It is to be noted that the on-chip input termination resistor circuit is also referred to as an ODT (On Die Termination) circuit or an OCT (On Chip Termination) circuit. In the following description, the term "ODT circuit" will be used.

The ODT circuit is a circuit placed for the purpose of matching the impedance on the side of semiconductor memories with the characteristic impedance on the side of the substrate interconnection to secure waveform quality. However, a resister element (at 50 ohms, in general) matched with the characteristic impedance of the substrate interconnection is connected in series between a power source and a ground (GND). Accordingly, direct-current (DC) electricity constantly flows between the power source and the ground (GND), which causes a problem of increased power consumption in the semiconductor memories. The increased power consumption in the semiconductor memories also causes increased power consumption in the entire signal transmission system. In the case where the semiconductor memory is a flash memory in particular, the increased power consumption results in higher chip temperature, which leads to a larger leakage current and a shorter data retention period (retention period). This causes a problem of a shortened life span of the flash memory.

CITATION LIST

Patent Literature

PTL 1: JP Patent Publication (Kokai) No. 2005-236965 A

SUMMARY OF INVENTION

Technical Problem

PTL 1 discloses a method for adjusting the impedance of the entire transmission line including microscopic transmission lines with a simple circuit configuration different from the configuration of the ODT circuit. However, in the method disclosed in PTL 1, a termination resistor is connected to a power source on a constant basis, which causes increased power consumption in the entire system and in semiconductor elements. Moreover, in the method disclosed in PTL 1, the influence of increased power consumption becomes notable when a plurality of semiconductor elements are connected. Particularly, when the temperature of the semiconductor elements is increased by heat generated due to the increased power consumption, the problem of the shortened life span of the semiconductor elements becomes prominent.

Solution to Problem

In order to solve the aforementioned problems, a configuration stated in the scope of the claims for example is employed. Although the specification of the present invention includes a plurality of means to solve the aforementioned problems, there is proposed as one example a semiconductor device which connects a resistor element in parallel with a signal interconnection which connects between first and second semiconductor elements having an ODT circuit with a switching function.

Advantageous Effects of Invention

According to the present invention, it becomes possible to simultaneously achieve (1) power-saving in the entire signal transmission system implemented in a semiconductor device, (2) power-saving in semiconductor elements, and (3) enhancement in signal quality. The above-stated problems, configurations, and effects will become apparent in the following description of the embodiments.

BRIEF DESCRIPTION OF DRAWINGS

FIG. 2A is a view showing an analysis model of a conventional circuit.

FIG. 2B is a view showing an analysis model according to the first example.

FIG. 3A is a view showing an analysis result of the conventional circuit.

FIG. 3B is a view showing an analysis result according to the first example.

DESCRIPTION OF EMBODIMENTS

Hereinafter, the embodiments of the present invention will be described with reference to the drawings. The embodiment aspects of the present invention are not limited to later-described Examples, and various deformations are possible in the range of the technical concept thereof. For example, later-described Examples are not independent of each other and are in such relation that one Example is in part or in their entirety a modified example, an application example, a detailed description, and a supplementary description of other Examples. Moreover, the number of the elements in the following Examples is optional unless otherwise specified and unless clearly limited to a specific number in principle.

Example 1

Figure 1:
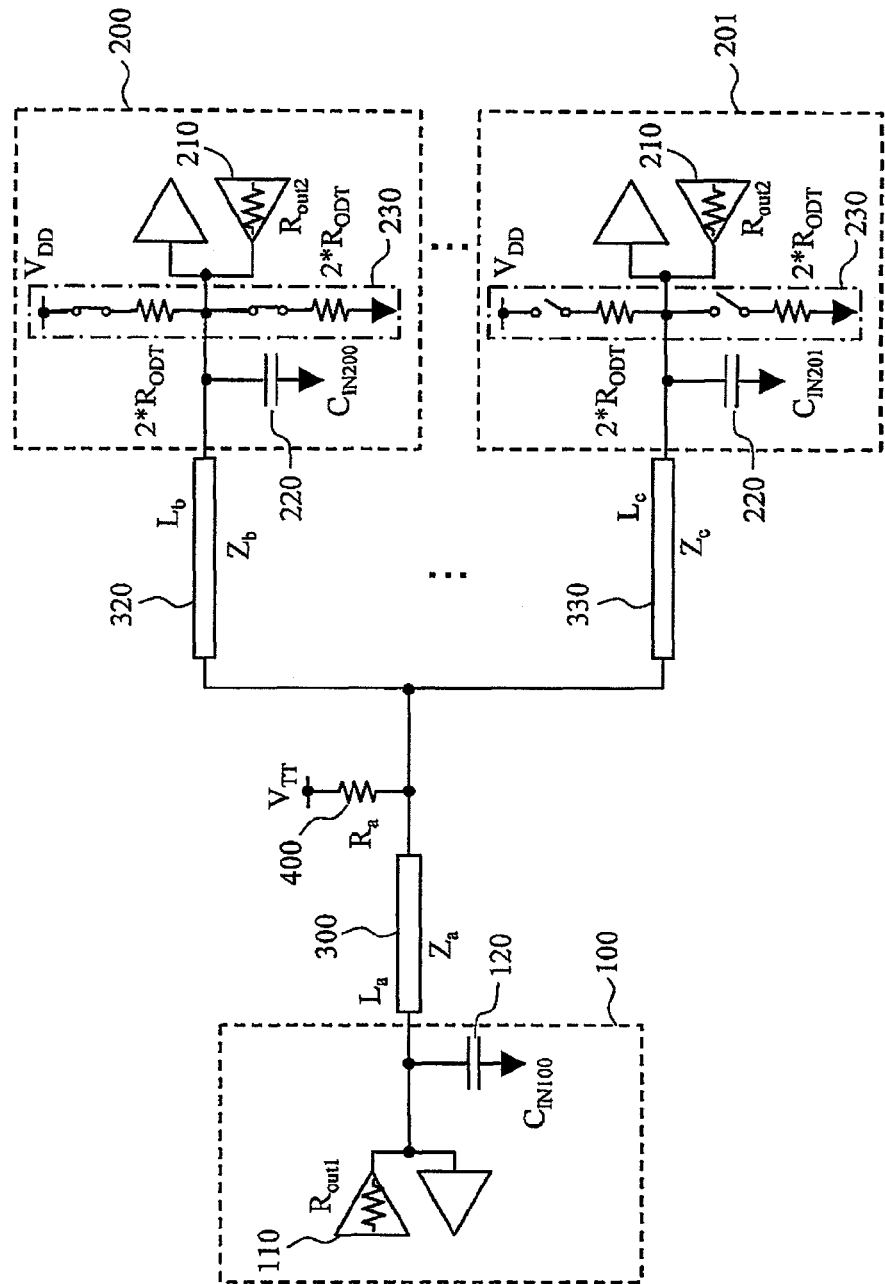
FIG. 1 is a view showing a configuration of a semiconductor device (signal transmission system) according to a first example.

A configuration of a signal transmission system formed in a semiconductor device according to the present example is shown in FIG. 1. The signal transmission system shown in FIG. 1 represents the case where a plurality of second semiconductor elements 200 and 201 (e.g., semiconductor memories) are connected to a first semiconductor element 100 (e.g., a memory controller) via substrate interconnections 300, 320 and 330. It is to be noted that only one second semiconductor element may be connected to the first semiconductor element 100.

The first semiconductor element 100 incorporates an ODT circuit (not shown), an input capacitance 120 ($C_{IN100}$), and a bidirectional IO buffer circuit 110. One end of the input capacitance 120 ($C_{IN100}$) is connected to a signal line, while the other end thereof is connected to a ground (GND). The configuration of the ODT circuit is similar to the circuit configuration of a later-described ODT circuit 230.

The second semiconductor element 200 incorporates an ODT circuit 230, an input capacitance 220 ($C_{IN100}$), and a bidirectional IO buffer circuit 210. The ODT circuit 230 is constituted from a series circuit (composed of two switch elements and two resistor elements connected in series) connected between a power source $V_{DD}$ and a ground (GND). The switch element may be constituted with a MOS transistor for example. In this specification, the ODT circuit 230 having a switch element on both the power source side and the ground (GND) side is also referred to as an ODT circuit with a switching function. One end of the input capacitance 220 ($C_{IN200}$) is connected to a signal line, while the other end thereof is connected to a ground (GND).

The second semiconductor element 201 incorporates an ODT circuit 230, an input capacitance 220 ($C_{IN201}$), and a bidirectional IO buffer circuit 210. One end of the input capacitance 220 ($C_{IN201}$) is connected to a signal line, while the other end thereof is connected to a ground (GND).

The first semiconductor element 100 and the second semiconductor elements 200 and 201 are connected via the substrate interconnections 300, 320, and 330. The substrate interconnections 300, 320, and 330 include interconnection patterns formed on the surface of the substrate as well as bonding wires. In this specification, a section from a position (branch point) where the substrate interconnection branches out to the first semiconductor element 100 is referred to as the substrate interconnection 300, a section from the branch point to the second semiconductor element 200 is referred to as the substrate interconnection 320, and a section from the branch point to the second semiconductor element 201 is referred to as the substrate interconnection 330. The signal transmission system according to the Example implements bidirectional signal transmission through these substrate interconnections 300, 320, and 330.

A resistor element 400 can be connected in parallel with the signal transmission line at an arbitrary position on the substrate interconnection 300 and the substrate interconnections 320 and 330. FIG. 1 shows an example in which the resistor element 400 is connected to the branch point of the signal interconnection in parallel. Various methods can be considered for mounting the resistor element 400. There are, for example, a method of connecting the resistor element 400 between the power source and a substrate interconnection, a method of connecting the resistor element 400 between the ground (GND) and a substrate interconnection, a method of forming the resistor element 400 as a built-in element of the substrate, and a method of connecting the resistor element 400 that is of a resistor array type. It is to be noted that the number (or connecting location) of the resistor elements 400 is not limited to one but may be plural. The resistance value of the resistor element 400 is not limited to a fixed resistance value but may be variable. In the case where the resistor element 400 is a variable resistor, the resistance value thereof can freely be corrected to an optimum value when the resistance value of the resistor elements constituting the ODT circuit 230 on the side of the second semiconductor elements 200 and 201 has variations.

In the present example, the resistor element 400 is connected in parallel on the substrate interconnections 300 and the substrate interconnections 320 and 330 because of the following reasons.

One of the causes which degrade signal quality is a reflected wave. When the reflected wave is overlapped on a transmission signal, the transmission waveform is distorted and causes a transmission error of the signal. One of the causes which generate a reflected wave is mismatching of the impedance between the receiving end of the semiconductor element and the substrate interconnection. Accordingly, a resistor element may be inserted at the receiving end in parallel with the signal line in order to match the impedance of the receiving end and the substrate interconnection. However, when the resistor element is connected to the signal line on a constant basis without a switching function, the power consumption in the signal transmission system is increased. Further, in the case of a bidirectional signal transmission system, unnecessary resistance is connected to the transmitting end of the signal, which causes deterioration in signal quality.

Accordingly, as shown in FIG. 1, the ODT circuit 230 with a switching function is used as a termination circuit of the second semiconductor elements (semiconductor memories in particular) 200 and 201. The ODT circuit 230 commonly connected to the bidirectional IO buffer 210 is controlled so that a switch thereof is turned on only when a signal is received and is turned off when a signal is not received or when a signal is transmitted. On/off control of the switch is executed by an unshown control section. In FIG. 1, the second semiconductor element 200 receives a signal, so that the switch constituting the ODT circuit 230 is controlled to be in ON state. Meanwhile, the switch of the ODT circuit 230 in the second semiconductor element 201 which does not receive a signal is controlled to be in OFF state. Thus, in the ODT circuit 230 which allows on/off control of the switch, the resistor element is not constantly connected between the power source and the grounds (GND), so that unnecessary electric power consumed in the second semiconductor elements 200 and 201 can be suppressed.

However, a technical problem as shown below is not yet solved only by mounting the ODT circuit 230 with a switching function in the second semiconductor elements 200 and 201 (without parallel connection of the resistor element 400 on the interconnection pattern). The characteristic impedance of the substrate interconnection is generally 50 ohms. Therefore, in order to adjust the termination circuits of the second semiconductor elements 200 and 201 with the characteristic impedance, it is necessary to set each of the resistance values $R_{ODT}$ of two resistor elements constituting the ODT circuit 230 at 50 ohms (100 ohm in parallel).

This means that a direct current flows to the resistor element having a resistance value of 50 ohms at the time of signal reception. Power consumption is obtained by $V^2/R$. Therefore, a smaller resistance value generates larger power consumption. Consequently, with the ODT circuit 230 which sets resistance value $R_{ODT}$ equal to the characteristic impedance (at 50 ohms, in general) of the substrate interconnection for impedance matching with the substrate interconnection side, the power consumption in the second semiconductor elements 200 and 201 becomes larger. As a result, a heat value in the second semiconductor elements 200 and 201 is increased, which causes increased temperature. The increased temperature shortens the life span of the second semiconductor elements 200 and 201 in the case where the second semiconductor elements 200 and 201 are semiconductor memories. Thus, in order to achieve both the reduced power consumption in the signal transmission system and the enhancement in signal quality, it is insufficient just to adopt the ODT circuit 230 with a switching function as a termination circuit of the second semiconductor elements 200 and 201.

Accordingly, in the signal transmission system according to the present example, the resistor element 400 is connected in parallel on the substrate interconnections 300, 320 and 330 which connect the first semiconductor element 100 having the ODT circuit 230 to the second semiconductor elements 200 and 201 having the ODT circuit 230 with a switching function. Although one end of the resistor element 400 is connected to the power source $V_{TT}$ ($=V_{DD}/2$) that is a fixed power source in FIG. 1, the potential of the fixed power source to be connected is arbitrary.

As described later, mainly two technical effects can be expected by connecting the resistor element 400. One of the technical effects is that a higher resistance value can be configured since it becomes unnecessary to match the resistance value $R_{ODT}$ of the ODT circuit 230 used for suppressing the reflected wave with the characteristic impedance $Z_0$ of the substrate interconnections 320 and 330. If the resistance value $R_{ODT}$ of the ODT circuit 230 can be made larger than the characteristic impedance $Z_0$ of the substrate interconnections 320 and 330, the electric power consumed by the second semiconductor elements 200 and 201 and the heat value therein can be suppressed. The other technical effect is that the resistor element 400 can suppress the reflected wave as the matching of the characteristic impedance $Z_0$ of the substrate interconnections 320 and 330 is performed by the resistor element 400.

Hereinafter, a description will be given of a method of determining the resistance value $R_a$ of the resistor element 400. The resistance value $R_a$ is obtained by the following formula 1.

$$R_a = (1/Z_0 - 1/R_{ODT})^{-1} \quad \text{(Formula 1)}$$

where $Z_0$ is a characteristic impedance of the substrate interconnections 320 and 330, and $R_{ODT}$ is a resistance value of the resistor element constituting the ODT circuit 230. It is to be noted that the resistance value $R_a$ provided by the formula 1 is a nominal value and causes no technical problem if it is within the tolerable range of a resistance value (e.g., 5%, 10%, and 20%).

The interconnection lengths La, Lb, and Lc of the substrate interconnections 300, 320, and 330 should preferably satisfy the following formula 2, in which each of the interconnection lengths is expressed as L.

$$L < \lambda/6 \quad \text{(Formula 2)}$$

where $\lambda = f/V$ and $V = C/\sqrt{\epsilon_r}$. In this formula, C is light speed in a vacuum, and $\epsilon_r$ is a relative dielectric constant of the substrate. Also in this formula, $f = 0.35/Tr$, where Tr is rise/fall time of an input signal.

In this case, the termination resistance at the receiving end of the second semiconductor elements 200 and 201 is obtained by combining the resistance value $R_{ODT}$ of the resistor element constituting the ODT circuit 230 and the resistance value $R_a$ of the resistor element 400. For example, when it is supposed that the characteristic impedance $Z_0$ of the substrate interconnection is 50 ohms and the resistance value $R_{ODT}$ of the resistor element constituting the ODT circuit 230 is 150 ohms (300 ohms in parallel), then the resistance value $R_a$ of the resistor element 400 is 75 ohms.

This means that the resistance value $R_{ODT}$ of the resistor element constituting the ODT circuit 230, which is 50 ohms when the impedance matching is performed only by the ODT circuit 230, can be changed to 150 ohms in this Example. The value of 150 ohms is 3 times larger than the resistance value in the case where the resistor element 400 is not used. Accordingly, the power consumption in the second semiconductor elements 200 and 201 can be reduced to one third.

In the system configuration as shown in FIG. 1 where a plurality of the second semiconductor elements are connected to the first semiconductor element 100, only the ODT circuit 230 in the semiconductor element (e.g., the semiconductor element 200) which receives a signal is put in ON state, and the ODT circuit 230 in other semiconductor elements (e.g., the semiconductor element 201) which do not receive a signal is put in OFF state. Accordingly, a reflected wave of a signal is generated at the receiving end of other semiconductor elements which do not receive a signal. Generation of the reflected wave cannot be avoided.

In this case, the reflected wave transmits to the receiving end of the semiconductor element (e.g., the semiconductor element 200) which receives a signal through the substrate interconnection, and degrades the waveform quality of an original signal wave. However, in the configuration for connecting the resistor element 400 in parallel in the middle of the substrate interconnection 300 and the substrate interconnections 320 and 330 (i.e., at the branch point of the substrate interconnections) as in the present example, the resistor element 400 functions to reduce the reflected wave sneaked from the semiconductor elements which do not receive a signal. As a result, in the present example, waveform quality can also be enhanced.

The inventor of the invention confirmed the aforementioned technical effects also as the form of analysis results. A conventional circuit is shown in FIG. 2A and a corresponding analysis result is shown in FIG. 3A. The circuit of the present example is shown in FIG. 2B, and a corresponding analysis result is shown in FIG. 3B. The conventional circuit herein has only the ODT circuit 230 with a switching function, and corresponds to the signal transmission system which does not connect the resistor element 400 onto a wired substrate.

Equivalent circuit diagrams (a) in FIG. 2A and FIG. 2B show equivalent circuits in the case where the semiconductor element 1 writes a signal onto the semiconductor element 2, while equivalent circuit diagrams (b) show equivalent circuits in the case where the semiconductor element 1 reads a signal from the semiconductor element 2.

Waveform charts (a) in FIG. 3A and FIG. 3B show the waveforms which appear at the receiving end (on the semiconductor element 2 side) in the case where the semiconductor element 1 writes a signal upon the semiconductor element 2, while waveform charts (b) show the waveforms which appear at the receiving end (on the semiconductor element 1 side) in the case where the semiconductor element 1 reads a signal from the semiconductor element 2. It is to be noted that the receiving ends used for observing the signal waveforms of FIG. 3A and FIG. 3B are expressed as observation points with use of an arrow in FIG. 2A and FIG. 2B.

The analysis results of FIG. 3A and FIG. 3B have the following preconditions: the transmission rate of a signal is 400 Mbps; on-resistance Rout1 of the IO buffer circuit is 50 ohms; characteristic impedance of the substrate interconnection 300 is 50 ohms, and the length thereof is 150 mm; the resistor element 400 is 75 ohms; characteristic impedance of the substrate interconnection 320 is 50 ohms, and the length thereof is 50 mm; characteristic impedance of the substrate interconnection 330 is 50 ohms, and the length thereof is 50 mm; input capacitance $C_{IN100}$ of the first semiconductor element 100 is 8 pF; and input capacitance $C_{IN200}$ and $C_{IN201}$ in the second semiconductor elements 200 and 201 are 20 pF.

As is clear from the comparison between FIG. 3A and FIG. 3B, a reflected wave is suppressed, jitters of a transmission signal are reduced, and signal quality is enhanced in the bidirectional signal transmission system in which the resistor element 400 is connected in parallel on the substrate interconnection as in the present example. For example, the jitter at the time of signal write was observed to be reduced by about 50% from 820 picoseconds to 421 picoseconds, while the jitter at the time of signal read was observed to be reduced by about 20% from 1470 picoseconds to 1180 picoseconds.

As described above, employment of the signal transmission system according to the present example can suppress power consumption both in the entire signal transmission system and in single component members of the second semiconductor elements 200 and 201. The signal transmission system according to the present example can also enhance signal quality at the same time.

Example 2

Figure 4:
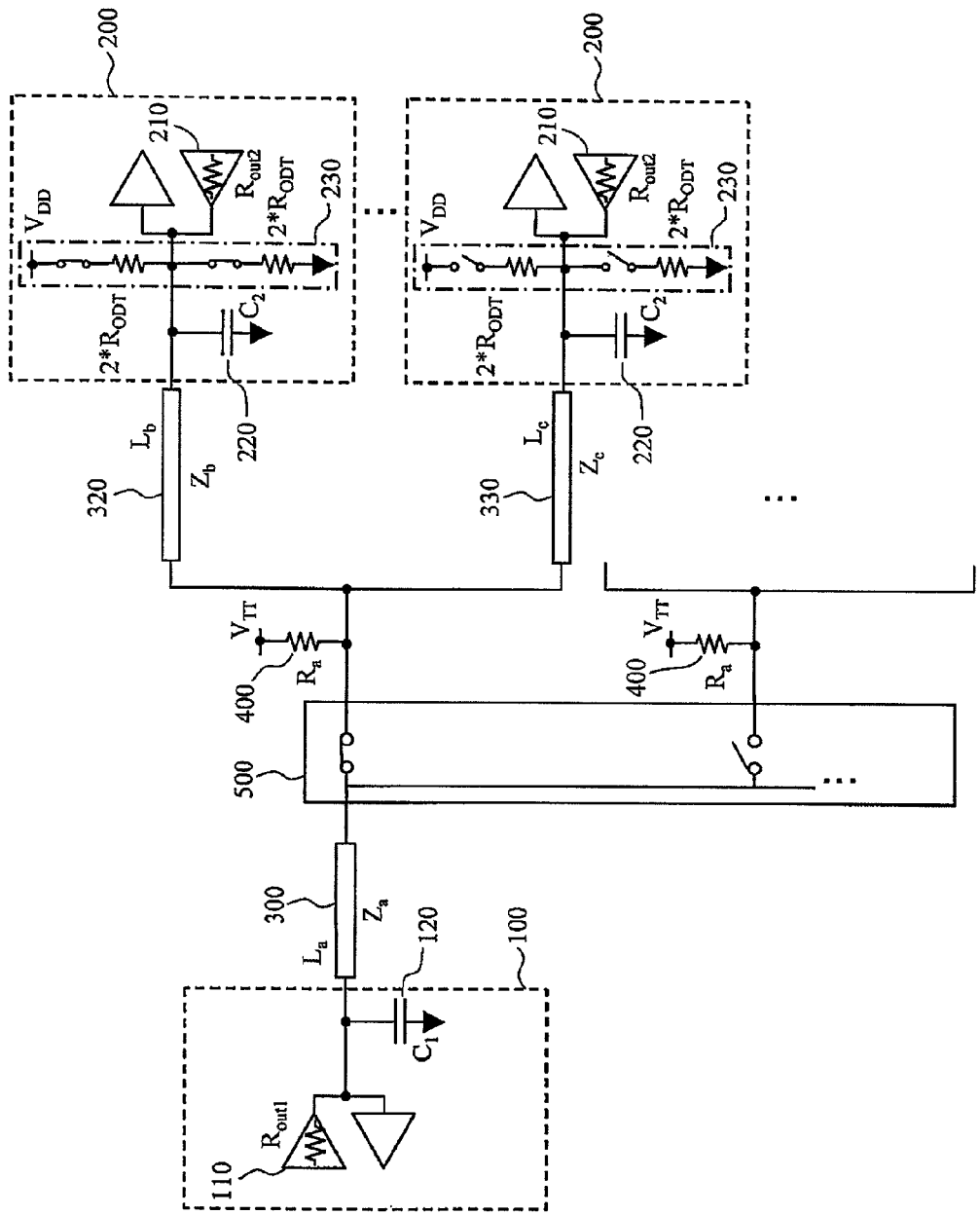
FIG. 4 is a view showing a configuration of a semiconductor device (signal transmission system) according to a second example.

A connection configuration of a signal transmission system according to the present example is shown in FIG. 4. In FIG. 4, component members corresponding to those in FIG. 1 are designated by the same reference signs. The connection configuration of the present example is adequate for the case of increasing the number of the second semiconductor elements to be connected (for the case of increasing capacity when the second semiconductor element is a semiconductor memory).

The present example is different from the Example 1 in two points: one point being a bus switch 500 connected to the substrate interconnection 300; and the other point being the resistor element 400 connected in parallel with each bus line switched by the bus switch 500. It is to be noted that the configuration for connecting only one resistor element 400 on the side of the substrate interconnection 300 may also be employed. The bus switch 500 is a known component and so the detailed description thereof will be omitted. Internal switches constituting the bus switch 500 are formed from, for example, MOS transistors.

The bus switch 500 exclusively connects only one bus line to the substrate interconnection 300. Therefore, the equivalent circuit of the bus line selected by the bus switch 500 shares the same connecting relation with the first example. Consequently, in the present example, the same effects as those in Example 1 are implemented. Moreover, in the present example, the number of the second semiconductor elements connected to the first semiconductor element 100 can be increased arbitrarily. When the second semiconductor element is a semiconductor memory in particular, arbitrary increase in capacity may also be implemented.

Example 3

The signal transmission system described in Example 1 is also applicable to SIP (System In Package) configuration in which a signal transmission system is configured in one package. Examples of applying the signal transmission system to the SIP configuration are shown in FIG. 5 and FIG. 6.

Figure 5:
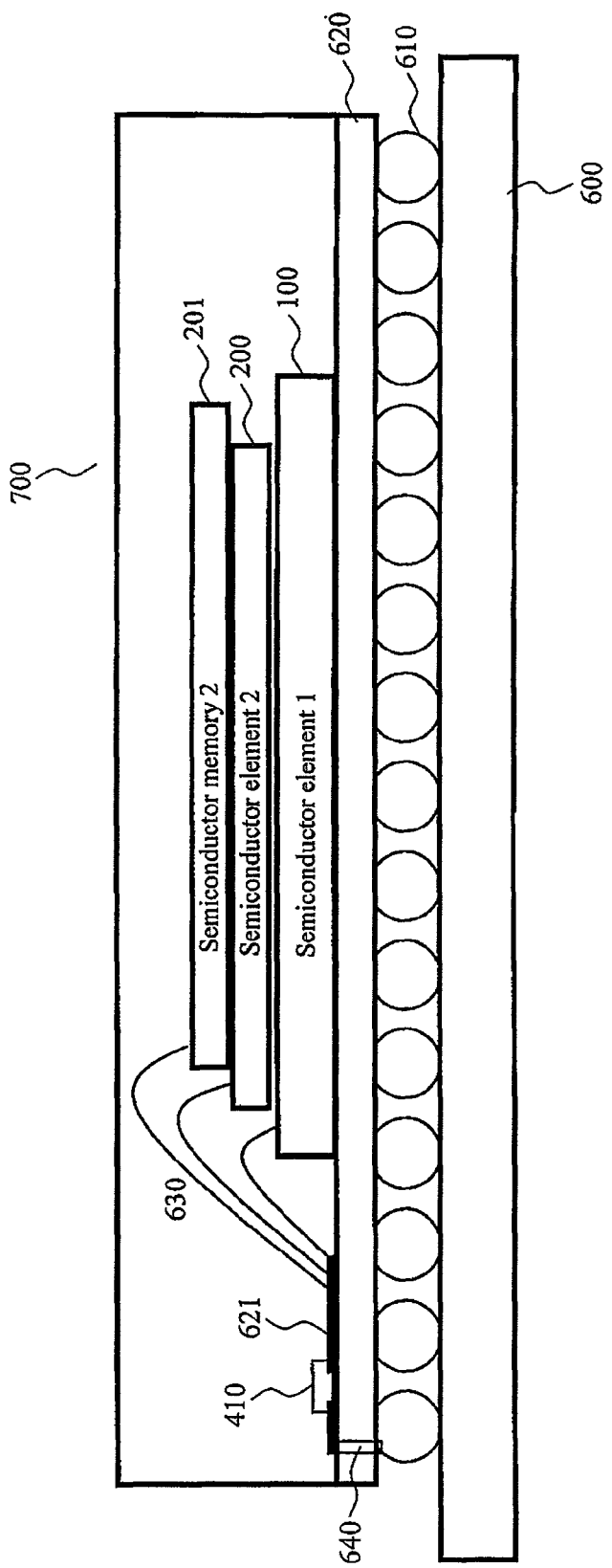
FIG. 5 is a view showing a configuration of a semiconductor device (signal transmission system) according to a third example.

FIG. 5 shows an example of stack-mounting second semiconductor elements 200 and 201 on the first semiconductor element 100. FIG. 6 shows an example in which only the second semiconductor elements 200, 201 and 202 are stack-mounted while the first semiconductor element 100 is mounted on an interposer substrate 620 on which the second semiconductor element 200 is also mounted. Both in FIG. 5 and FIG. 6, the interposer substrate 620 on the side of a SIP 700 is surface-mounted on a substrate 600 via a BGA (Ball Grid Array) 610, or a lead frame (not shown). At least one via 640 is formed in the interposer substrate 620, and the via 640 electrically connects the mounting surface of the substrate and the mounting surface of the semiconductor element.

In the circuit configuration shown in FIG. 5, signal transmission among the semiconductor elements 100, 200 and 201 is implemented through a bonding wire 630 connected to each signal end. One end of each bonding wire 630 is connected to an interconnection pattern 631 formed on the interposer substrate 620. A resistor element 410 is connected to the interconnection pattern 631 in parallel with the signal transmission line. The resistor element 410 corresponds to the resistor element 400 of Example 1.

Figure 6:
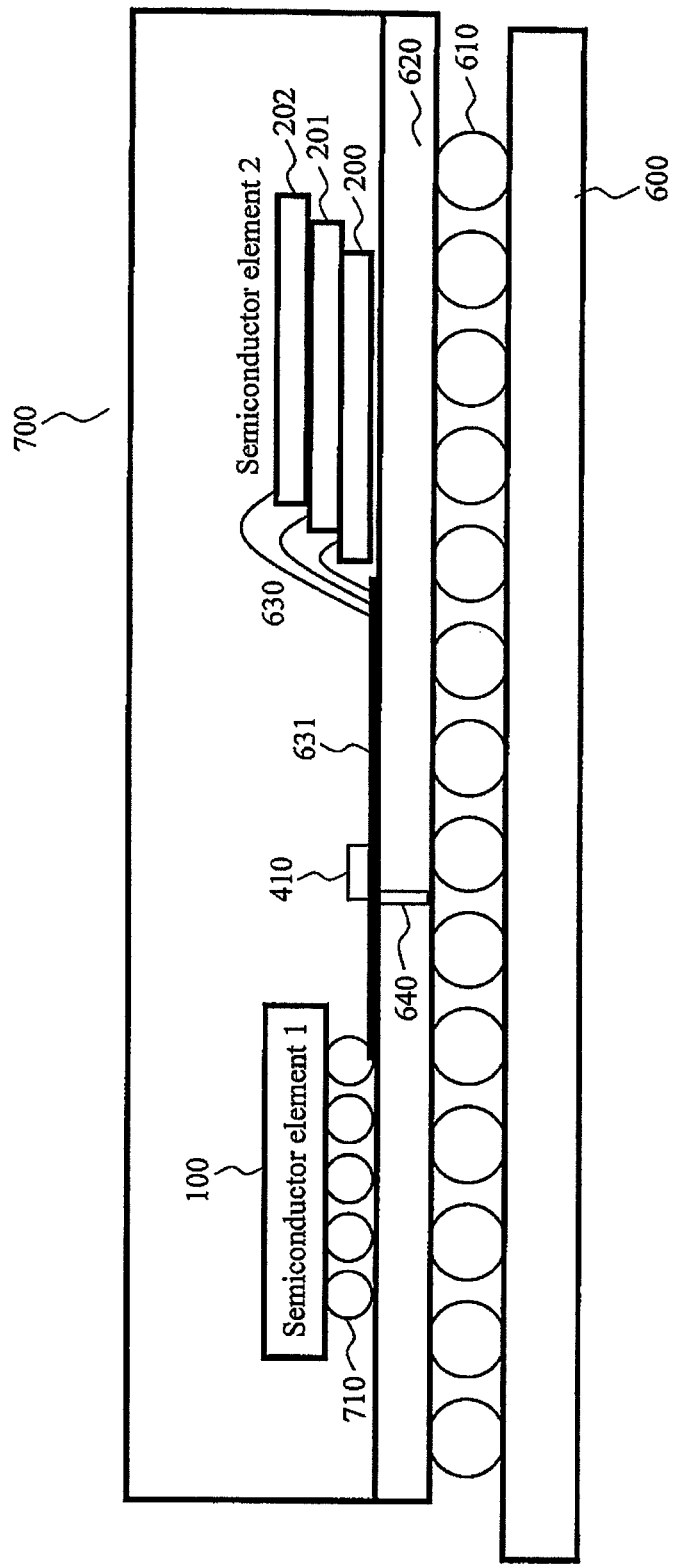
FIG. 6 is a view showing another configuration of the semiconductor device (signal transmission system) according to the third example.

In the circuit configuration shown in FIG. 6, the first semiconductor element 100 is mounted on the surface of the interposer substrate 620 via C4 (Control Collapse Chip Connection) bumps 710. A part of the C4 bumps 710 is connected to the interconnection pattern 631 formed on the interposer substrate 620. On end side of the bonding wire 630 is connected to each signal end of the second semiconductor elements 200, 201 and 202, while the other end side is connected to the interconnection pattern 631. Also in FIG. 6, the resistor element 410 is connected to the interconnection pattern 631 in parallel with the signal transmission line. The resistor element 410 corresponds to the resistor element 400 of Example 1.

The equivalent circuit of the present example is similar to that of Example 1 even though the mounting method thereof is different. Consequently, in the present example, the same effects as those in Example 1 can be implemented. When the SIP configuration is adopted as in the present example, the mounting area can be reduced and thereby the interconnection length between chips can be shortened. As a result, further enhancement in signal quality can be expected.

Example 4

Figure 7:
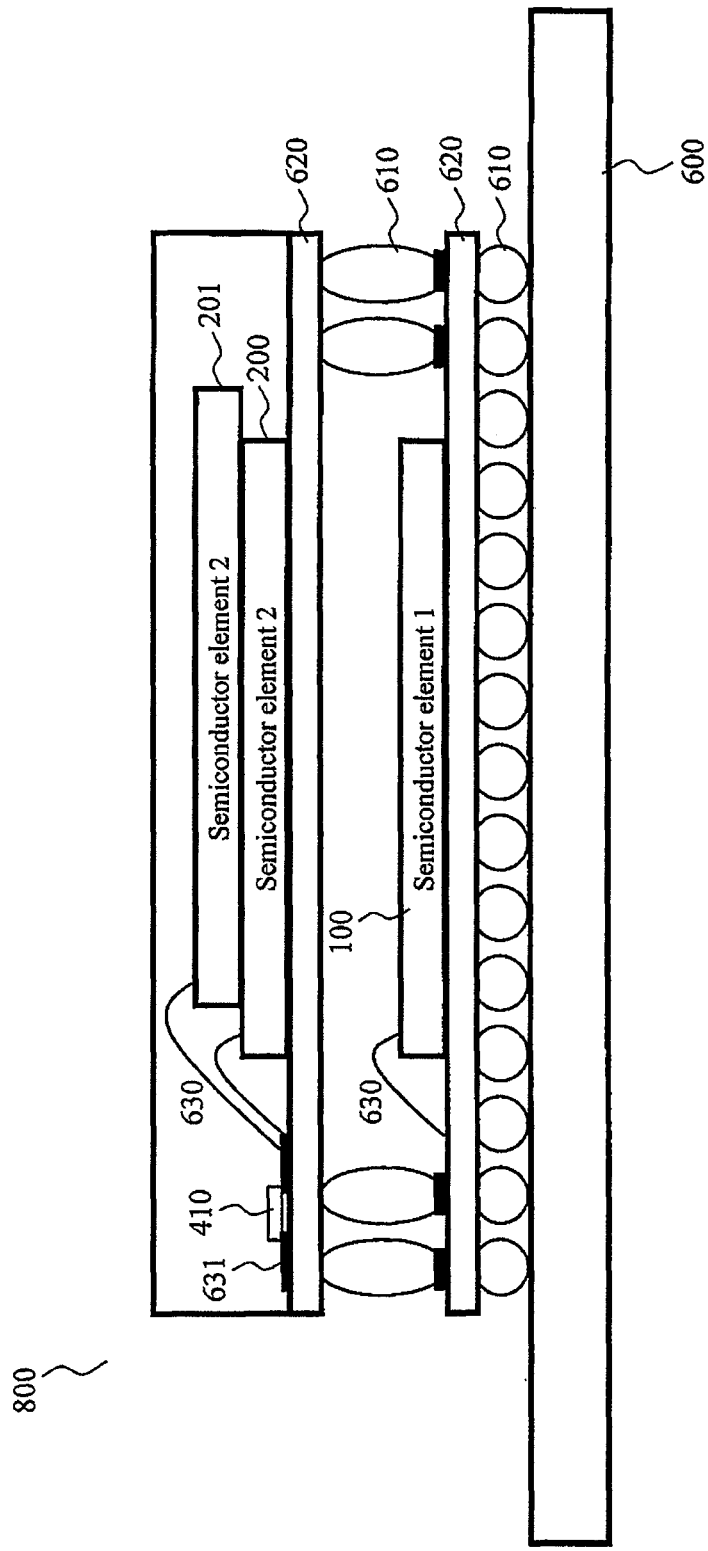
FIG. 7 is a view showing a configuration of a semiconductor device (signal transmission system) according to a fourth example.

The signal transmission system described in Example 1 is also applicable to PoP (Package on Package) configuration. A configuration example of a Package on Package 800 is shown in FIG. 7. In the case of FIG. 7, a first-layer interposer substrate 620 is surface-mounted on the surface side of a substrate 600 via a BGA 610. The first semiconductor element 100 is surface-mounted on the first-layer interposer substrate 620. It is to be noted that a signal end of the first semiconductor element 100 is connected to an unshown interconnection pattern via the bonding wire 630.

A package incorporating the second semiconductor elements 200 and 201 is mounted on the upper surface side of the first semiconductor element 100 which is surface-mounted on the first-layer interposer substrate 620 via the BGA 610. In this configuration, the second semiconductor elements 200 and 201 are mounted on the surface of a second-layer interposer substrate 620. One end side of the bonding wire 630 connected to each of the signal ends of the second semiconductor elements 200 and 201 is connected to an interconnection pattern 631 formed on the second-layer interposer substrate 620. The interconnection pattern 631 is connected to an unshown conductive pattern on the back side of the second-layer interposer substrate 620 through an unshown via. The first semiconductor element 100 positioned on the first layer and the second semiconductor elements 200 and 201 on the second layer are connected to each other through the bonding wire 630 (first layer), the BGA 610, the unshown conductive pattern, the interconnection pattern 631, and the bonding wire 630 (second layer). Through this transmission line, bidirectional transmission between the first semiconductor element 100 and the second-layer second semiconductor elements 200 and 201 is implemented.

In the present example, a resistor element 410 is connected to the interconnection pattern 631 in parallel with the signal transmission line. The resistor element 410 corresponds to the resistor element 400 of Example 1.

Also in the present example, the equivalent circuit has the same connection configuration as in Example 1. Consequently, in the present example, the same effects as those in Example 1 can be implemented. When the PoP configuration is adopted as in Example 3, the mounting area can be reduced and thereby the interconnection length between packages can be shortened. As a result, further enhancement in signal quality can be expected.

In the case of the present example, the resistor element 410 connected in parallel with the substrate interconnection is mounted inside a package. This makes it possible to reduce the mounting area. In this way, when the resistor element 410 is mounted in the package also including the second semiconductor elements 200 and 201, the resistance value of the resistor element 410 can be designed integrally with the resistance value $R_{ODT}$ of the ODT circuit 230 placed at the receiving end of the second semiconductor elements 200 and 201. Accordingly, when the resistance value $R_{ODT}$ is corrected, the range of an influence by the correction can be kept to the design change of the same package.

Example 5

Figure 8:
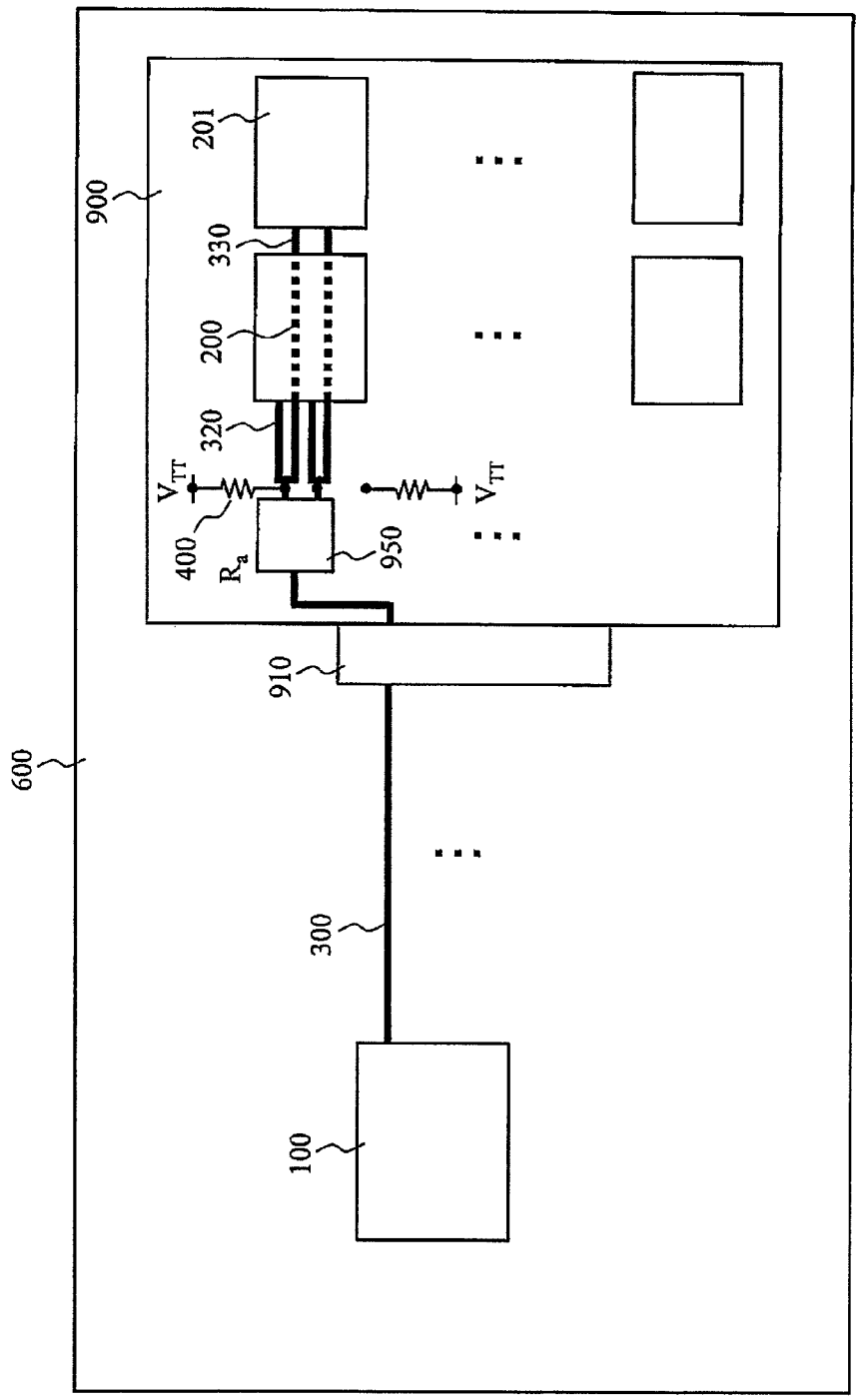
FIG. 8 is a view showing a configuration of a semiconductor device (signal transmission system) according to a fifth example.

A connection configuration of a signal transmission system according to the present example is shown in FIG. 8. The present example is also an application example of the first example. In the present example, the second semiconductor elements 200 and 201 (flash memory devices in particular) are mounted on a DIMM board 900, and a signal is transmitted to/from the first semiconductor element 100 mounted on the substrate 600.

In the present example, a substrate interconnection 300 on a substrate 600 side and an interconnection in the DIMM board 900 are connected via a connector 910. In DIMM board 900, one end side of the interconnection is connected to the connector 910 while the other end side thereof is connected to one end side of a randomizer 950 (or relay buffer) with a bus switch function. Bus lines on the other end side switched by the randomizer 950 (or relay buffer) are connected to the substrate interconnections 320 and 330 which are connected to the second semiconductor elements 200 and 201.

In the present example, the resistor element 400 connected in parallel with the signal interconnection is inserted on the bus line side (i.e., the substrate interconnections 320 and 330 side) switched by the randomizer 950 (or relay buffer). By employing this connection configuration, the connection configuration similar to that of Example 1 can be achieved in both the case where the first semiconductor element 100 communicates with the second semiconductor elements 200 and the case where the first semiconductor element 100 communicates with the second semiconductor element 201.

The configuration of the present example is effective not only for increasing the speed of the signal transmission system but also for increasing capacity through connection of a plurality of flash memory devices as well as for enhancing reliability of the flash memory devices. In the present example, employment of the configuration for mounting the resistor element 400 on the DIMM board 900 on which the second semiconductor elements 200 and 201 are also mounted makes it possible to design the resistance value of the resistor element 400 integrally with the resistance value $R_{ODT}$ of the ODT circuit 230 placed at the receiving end of the second semiconductor elements 200 and 201.

Example 6

Figure 9:
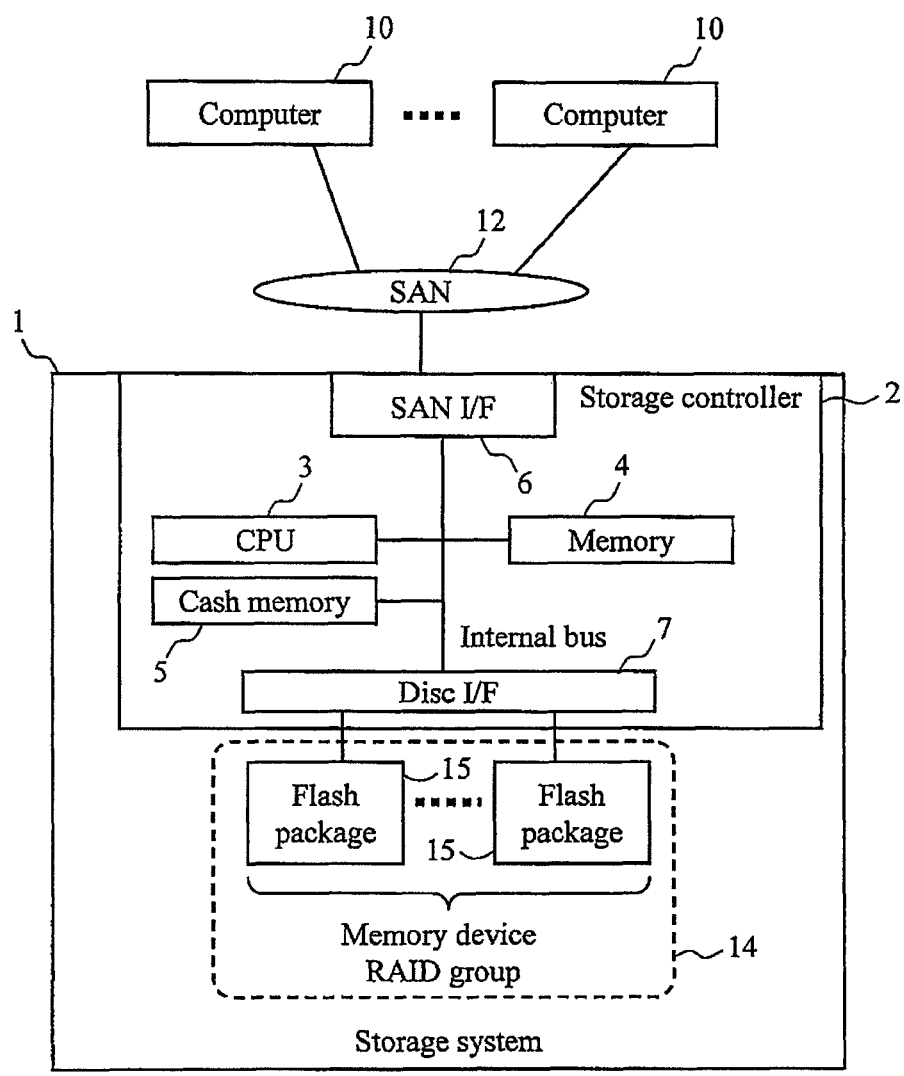
FIG. 9 is a view showing a configuration of a computer system that comprises a storage system according to a sixth example.
Figure 10:
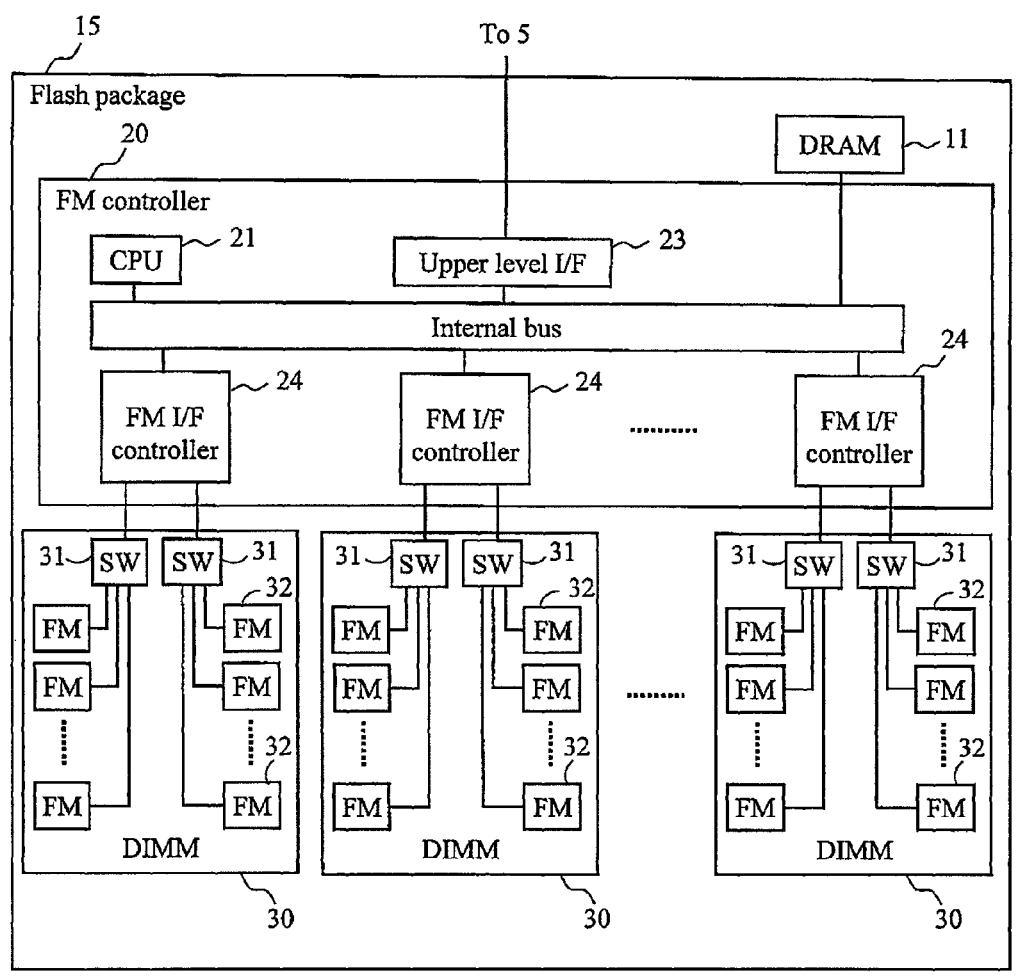
FIG. 10 is a view showing a configuration of a flash package that configures a memory device of the computer system shown in FIG. 9 according to a sixth example.

A signal transmission system according to the present example is applicable to the following computer system. FIG. 9 shows an example configuration of a computer system that comprises a storage system, and FIG. 10 shows an example configuration of a flash package that configures a memory device of the computer system shown in FIG. 9.

The computer system has a computer 10 and a storage system 1. The computer 10 and the storage system 1 are connected via communication network such as SAN (Storage Area Network) 12.

The storage system 1 has a controller 2 and a memory device group that is connected to the controller 2. The memory device group may be configured to include different types of storage media, or be composed of the same type of storage medium.

The controller 2 has a communication interface device, a memory device and a control device that is connected to them. For example, the communication interface device may include a SAN I/F 6 and a disc I/F 7.

The memory device may include a memory 4 and a cash memory 5, for example. The control device may include a CPU 3, for example. Such control device may include a dedicated hardware circuit that performs a predetermined process (compression process, decompression process, encryption process and decryption process, for example) in addition to the processor, such as the CPU 3.

The SAN I/F 6 is connected to a SAN 12. The disc I/F 7 is connected to the memory device group.

The memory 4 stores various types of programs and information that are used by the controller 2 for managing the storage system 1. The CPU 3 executes the programs on the basis of information stored in memory 4 to achieve various functions.

The cash memory 5 includes a volatile memory such as a normal DRAM (Dynamic Random Access Memory). The cash memory 5 temporarily stores data to be written on any one of the storage device group, and data read out from the storage device group. For example, the controller 2 receives a write request from the computer 10 to write the data to the cash memory 5 according to the write request, and then completes the write request (for example, a completion report for the write request is sent to the computer 10).

The memory device group has a RAID (Redundant Array of Independent (or Inexpensive) Disks) group. The RAID group stores data according to a predetermined RAID level. Based on the memory space of the RAID group, a logical volume (hereinafter referred to as simply VOL) will be created. The VOL may include some type of VOL that is provided to the computer 10, and other type of VOL that is not provided to the computer 10. The former type of VOL is designated in the I/O request sent from the computer 10. The latter type of VOL, for example, constitutes a pool element that includes a storage area assigned to the virtual VOL (VOL according to the Thin Provisioning) that is provided to the computer 10.

As a RAID group, a RAID group 14, for example, consists of a plurality of flash packages 15. A constitution of the flash packages 15 will be illustrated in FIG. 10.

FIG. 10 shows an example of the constitution of the flash packages 15. The flash package 15 has a plurality of FM (Flash Memory) chips 32, and a FM controller 20 connected to them.

The FM chip 32 is composed of a plurality of physical blocks, for example. Each physical block is composed of a plurality of physical pages. For example, FM chip 32 is composed of NAND type flash memory. Each cell of the FM chip 32 may consist of a SLC (Single Level Cell) or a MLC (Multi Level Cell).

The FM controller 20 has a communication interface device, a memory device, and a control device connected to them. The communication interface device may include an upper level I/F 23 and a FM I/F controller 24, for example. The memory device may include DRAM 11. The control device may include a CPU 21, for example.

The DRAM 11 stores various types of programs and information that are used for managing the flash package 15. The CPU 21 executes the programs on the basis of information stored in DRAM 11 to achieve various functions.

The FM I/F controller 24 is connected to a SW (Switch) 31 that is connected to a plurality of FM chips 32 mounted on DIMM substrate 30. FM I/F controller 24 controls each FM chip 32 independently by using CE (Chip Enable) signal.

The FM I/F controller 24 operates depending on a read/write request that is sent from the CPU 21. In the read/write request, a physical address (PBA (Physical Block Address)) concerning a region to be read or a region to be written is designated.

The FM I/F controller 24 calculates a physical block and a physical page concerning a region to be read or a region to be written based on the PBA, and then performs read/write process for the calculated physical block and physical page.

In addition, the FM I/F controller 24 has an ECC (Error Correction Code) generation circuit, and an ECC correction circuit. In a write process, the ECC generation circuit generates an ECC for a compressed data, and writes the compressed data and the ECC in the FM chip 32. Meanwhile, in a read process, the ECC correction circuit checks the compressed data (read data) that is read out from the FM chip 32. When data loss is found, the ECC correction circuit corrects the compressed data.

Aforementioned examples can be applied to a signal interconnection connecting the disc IF and the flash package (flash memory) illustrated in FIG. 9, and a signal interconnection connecting the FM I/F controller 24 and the flash memory (FM) 32 illustrated in FIG. 10.

Thus, the configuration of the present example is effective not only for increasing the speed of the signal transmission system but also for increasing capacity through connection of flash memory devices in the calculation system such as storage system as well as for enhancing reliability of the flash memory devices.

Other Examples

The present invention is not limited to the Examples disclosed and various modified examples are included therein. It should be understood that the Examples disclosed above are described in detail for easy understanding of the present invention. Therefore, the present invention is not necessarily restricted by the system configuration provided with all the details described therein. It should be also understood that a part of the configuration in one Example may be replaced with the configuration of other Examples, and the configuration of one Example may be added to the configuration of other Examples. Moreover, it is possible to add other configurations to a part of the configuration of each Example, and to delete and replace a part of the configuration of each Example.

Signal interconnections and respective elements described in the Examples are only illustrative for the sake of explanation and do not necessarily represent all the signal interconnections and elements necessary as a product. In actuality, plural types of signal interconnection topologies for connecting each configuration and plural elements in each configuration may be embodied.

REFERENCE SIGNS LIST

1 Storage system
2 Controller
3, 21 CPU
4 Memory
5 Cash memory
6 SAN I/F
7 Disc I/F
10 Computer
11 DRAM
12 SAN (Storage Area Network)
14 RAID group
15 Flash package
20 FM controller
23 Upper level I/F
24 FMI/F controller
30 DIMM substrate
31 SW (Switch)
32 FM (Flash Memory) chip
100 Semiconductor element 1
110 Bidirectional IO buffer circuit
120 Input capacitance
200, 201, 202 Semiconductor element 2
210 Bidirectional IO buffer circuit
220 Input capacitance
230 On-chip input termination resistor
300, 320, 330 Substrate interconnection
400, 410 Resistor element
500 Bus switch
600 Substrate
610 BGA
620 Interposer substrate
630 Wire bond
631 Interconnection pattern
640 Via
700 Sip (System in Package)
710 C4 bumps
800 PoP (Package on Package)
900 DIMM board
910 Connector
950 Randomization circuit with a bus switch function (randomizer)

The invention claimed is:
1. A semiconductor device, comprising:
a first semiconductor element having an on-chip input termination resistor circuit with a switching function and a bidirectional IO buffer circuit;

a second semiconductor element having an on-chip input termination resistor circuit with a switching function and a bidirectional IO buffer circuit; and
a resistor element connected in parallel with a signal interconnection at an arbitrary position on a substrate interconnection which connects the first semiconductor element and the second semiconductor element,
wherein
a resistance value $R_a$ of the resistor element satisfies a following formula 1:

$$R_a=(1/Z_0-1/R_{ODT})^{-1} \quad \text{(Formula 1)}$$

where $Z_0$ is characteristic impedance of the signal interconnection, and
$R_{ODT}$ is a resistance value of the resistor element constituting the on-chip input termination resistor circuit.

2. The semiconductor device according to claim 1, wherein
a length of signal interconnection L1 between the first semiconductor element and the resistor element and/or a length of signal interconnection L2 between the second semiconductor element and the resistor element satisfy a following formula 2:

$$L1, L2 < \text{lambda}/6 \quad \text{(Formula 2)}$$

where lambda=f/V (f=0.35/Tr in which Tr is rise/fall time of an input signal), and V=C/root epsilon$_r$ (C is light speed in a vacuum and epsilon$_r$ is a relative dielectric constant of a substrate).

3. The semiconductor device according to claim 1, wherein the resistor element is connected to a branch point on the substrate interconnection where the first semiconductor element and the second semiconductor element are connected.

4. The semiconductor device according to claim 1, wherein the first semiconductor element and the second semiconductor element are connected via a bus switch.

5. The semiconductor device according to claim 4, wherein the resistor element is connected to respective bus lines switched by the bus switch.

6. The semiconductor device according to claim 1, wherein the first semiconductor element and the second semiconductor element are connected via a randomizer or a relay buffer.

7. The semiconductor device according to claim 6, wherein the resistor element is connected to a substrate interconnection in between the randomizer or the relay buffer and the second semiconductor element.

8. The semiconductor device according to claim 6, wherein the resistor element is connected to the substrate interconnection on a substrate with the second semiconductor element mounted thereon.

9. The semiconductor device according to claim 1, wherein the second semiconductor element is a semiconductor memory, and
the first semiconductor element is a memory controller which controls the semiconductor memory.

10. The semiconductor device according to claim 9, wherein
the semiconductor memory is a flash memory.

11. The semiconductor device according to claim 1, wherein
the first semiconductor element and/or the second semiconductor element are mounted in SIP (System in Package) configuration.

12. The semiconductor device according to claim 11, wherein
the resistor element is connected to the substrate interconnection inside a package.

13. The semiconductor device according to claim 1, wherein
the first semiconductor element and/or the second semiconductor element are mounted in PoP (Package on Package) configuration.

14. The semiconductor device according to claim 13, wherein
the resistor element is connected to the substrate interconnection inside a package.

15. A semiconductor device comprising:
a first semiconductor element having an on-chip input termination resistor circuit with a switching function and a bidirectional IO buffer circuit;
a second semiconductor element having an on-chip input termination resistor circuit with a switching function and a bidirectional IO buffer circuit; and
a resistor element connected in parallel with a signal interconnection at an arbitrary position on a substrate interconnection which connects the first semiconductor element and the second semiconductor element,
wherein the first semiconductor element and the second semiconductor element are connected via a bus switch.

16. The semiconductor device according to claim 15, wherein
the resistor element is connected to respective bus lines switched by the bus switch.

17. A semiconductor device comprising:
a first semiconductor element having an on-chip input termination resistor circuit with a switching function and a bidirectional IO buffer circuit;
a second semiconductor element having an on-chip input termination resistor circuit with a switching function and a bidirectional IO buffer circuit; and
a resistor element connected in parallel with a signal interconnection at an arbitrary position on a substrate interconnection which connects the first semiconductor element and the second semiconductor element,
wherein the first semiconductor element and the second semiconductor element are connected via a randomizer or a relay buffer.

18. The semiconductor device according to claim 17, wherein
the resistor element is connected to a substrate interconnection in between the randomizer or the relay buffer and the second semiconductor element.

19. The semiconductor device according to claim 17, wherein the resistor element is connected to the substrate interconnection on a substrate with the second semiconductor element mounted thereon.

* * * * *